(12) United States Patent
Fleischer

(10) Patent No.: US 8,936,163 B2
(45) Date of Patent: Jan. 20, 2015

(54) FLEXIBLE MOUNTING SYSTEM FOR ELECTRONIC DEVICES

(75) Inventor: Donald M. Fleischer, Oak Ridge, TN (US)

(73) Assignee: CCS-Inc., Christiansburg, VA (US)

( * ) Notice: Subject to any disclaimer, the term of this patent is extended or adjusted under 35 U.S.C. 154(b) by 354 days.

(21) Appl. No.: 13/362,767

(22) Filed: Jan. 31, 2012

(65) Prior Publication Data

US 2012/0193309 A1   Aug. 2, 2012

Related U.S. Application Data

(60) Provisional application No. 61/438,053, filed on Jan. 31, 2011.

(51) Int. Cl.
*A47F 7/00* (2006.01)
*H05K 5/02* (2006.01)

(52) U.S. Cl.
CPC .................................... *H05K 5/0204* (2013.01)
USPC ........... 211/26.2; 211/186; 211/190; 248/499

(58) Field of Classification Search
CPC .... B60P 7/0876; B60P 7/0823; B60P 7/0815; B60P 1/4457; B62P 7/04; H05K 5/0204; H05K 7/14; H05K 7/18; H05K 7/183; H05K 7/186; A47B 81/06; A47B 81/061; A47B 81/062; A47B 81/064
USPC .......... 211/26, 26.2, 186, 187, 190, 191, 204, 211/206; 248/503, 505, 499
See application file for complete search history.

(56) References Cited

U.S. PATENT DOCUMENTS

| | | | | |
|---|---|---|---|---|
| 253,211 A | * | 2/1882 | Lamson | 224/449 |
| 591,904 A | * | 10/1897 | Weber | 224/438 |
| 610,288 A | * | 9/1898 | Streeper | 224/436 |
| 3,351,356 A | * | 11/1967 | Clark et al. | 410/110 |
| 3,950,010 A | * | 4/1976 | Robertson | 410/110 |
| 4,227,669 A | * | 10/1980 | McInnis | 248/317 |
| 5,139,223 A | * | 8/1992 | Sedighzadeh | 248/324 |
| 5,193,955 A | | 3/1993 | Chou | |
| 5,310,152 A | * | 5/1994 | O'Neill | 248/329 |
| 5,328,310 A | | 7/1994 | Lockney | |
| 5,393,025 A | * | 2/1995 | Franklin | 248/317 |
| 5,424,912 A | | 6/1995 | Mikan | |
| 5,694,861 A | * | 12/1997 | Laukamm-Josten | 108/50.01 |
| 5,716,176 A | | 2/1998 | Anderson | |
| 5,772,369 A | * | 6/1998 | Lerman et al. | 410/96 |
| 5,772,371 A | | 6/1998 | Ackerman | |

(Continued)

*Primary Examiner* — Korie H Chan
(74) *Attorney, Agent, or Firm* — New River Valley IP Law, PC; Michele L. Mayberry

(57) ABSTRACT

The present invention is directed to the field of mounting systems used to secure, organize and protect electronic equipment in commercial and industrial settings. More particularly, the present invention relates to methods, systems, and devices for mounting non-uniform components in an organized and easily modifiable structure. Of particular interest are mounting systems for electronics components comprising: a) one or more flexible and elastic plastic mesh securing members; and b) one or more elongated support bars comprising: (i) a planar upper support member; (ii) opposing anterior and posterior flanges disposed at right angles to the upper support member; and (iii) a plurality of protrusions integral to or fixedly connected to the flanges which are operably configured for releasable engagement with the mesh.

20 Claims, 13 Drawing Sheets

(56) References Cited

U.S. PATENT DOCUMENTS

| | | |
|---|---|---|
| 5,876,167 A | 3/1999 | Selby |
| 6,012,694 A * | 1/2000 | Sullivan, III ................. 248/323 |
| 6,017,174 A | 1/2000 | Ross et al. |
| 6,021,047 A | 2/2000 | Lopez et al. |
| 6,095,345 A | 8/2000 | Gibbons |
| 6,152,664 A | 11/2000 | Dew et al. |
| 6,244,803 B1 | 6/2001 | Parish et al. |
| 6,345,944 B1 | 2/2002 | Florence |
| 6,419,433 B1 | 7/2002 | Chou |
| 6,435,786 B1 | 8/2002 | Breckel et al. |
| 6,557,926 B1 | 5/2003 | Bacher et al. |
| 6,637,991 B2 | 10/2003 | Looker et al. |
| 6,715,973 B2 | 4/2004 | Faber et al. |
| 6,760,226 B2 | 7/2004 | Chen |
| 6,783,312 B2 | 8/2004 | Smith |
| 7,070,373 B2 | 7/2006 | Brown |
| 7,134,558 B1 | 11/2006 | Mimlitch, III et al. |
| 7,522,428 B2 | 4/2009 | Nguyen |
| 7,529,097 B2 | 5/2009 | Coglitore et al. |
| 7,660,108 B2 | 2/2010 | Baker et al. |
| 8,567,018 B2 * | 10/2013 | Dahl et al. ................. 24/300 |

* cited by examiner

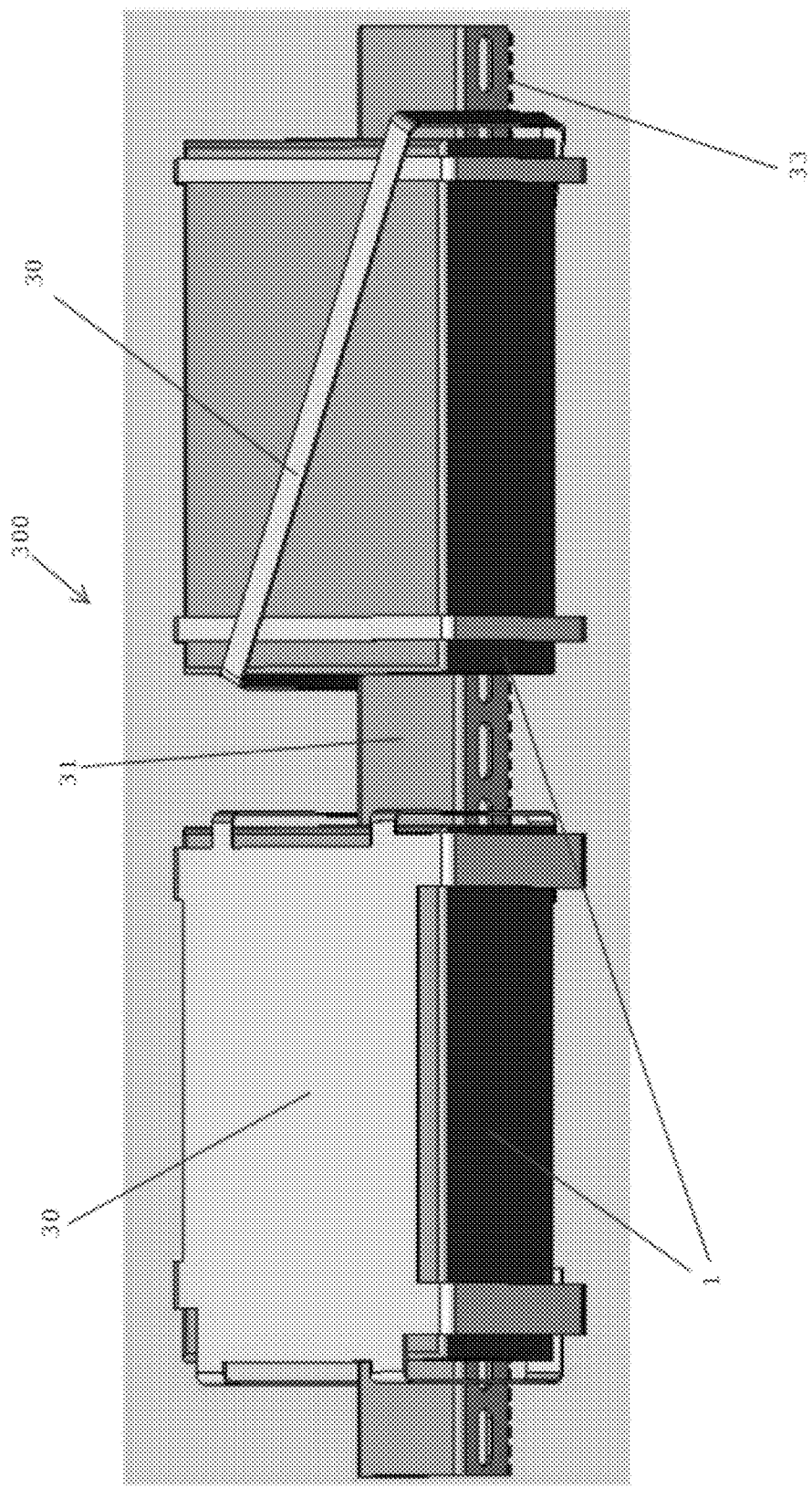

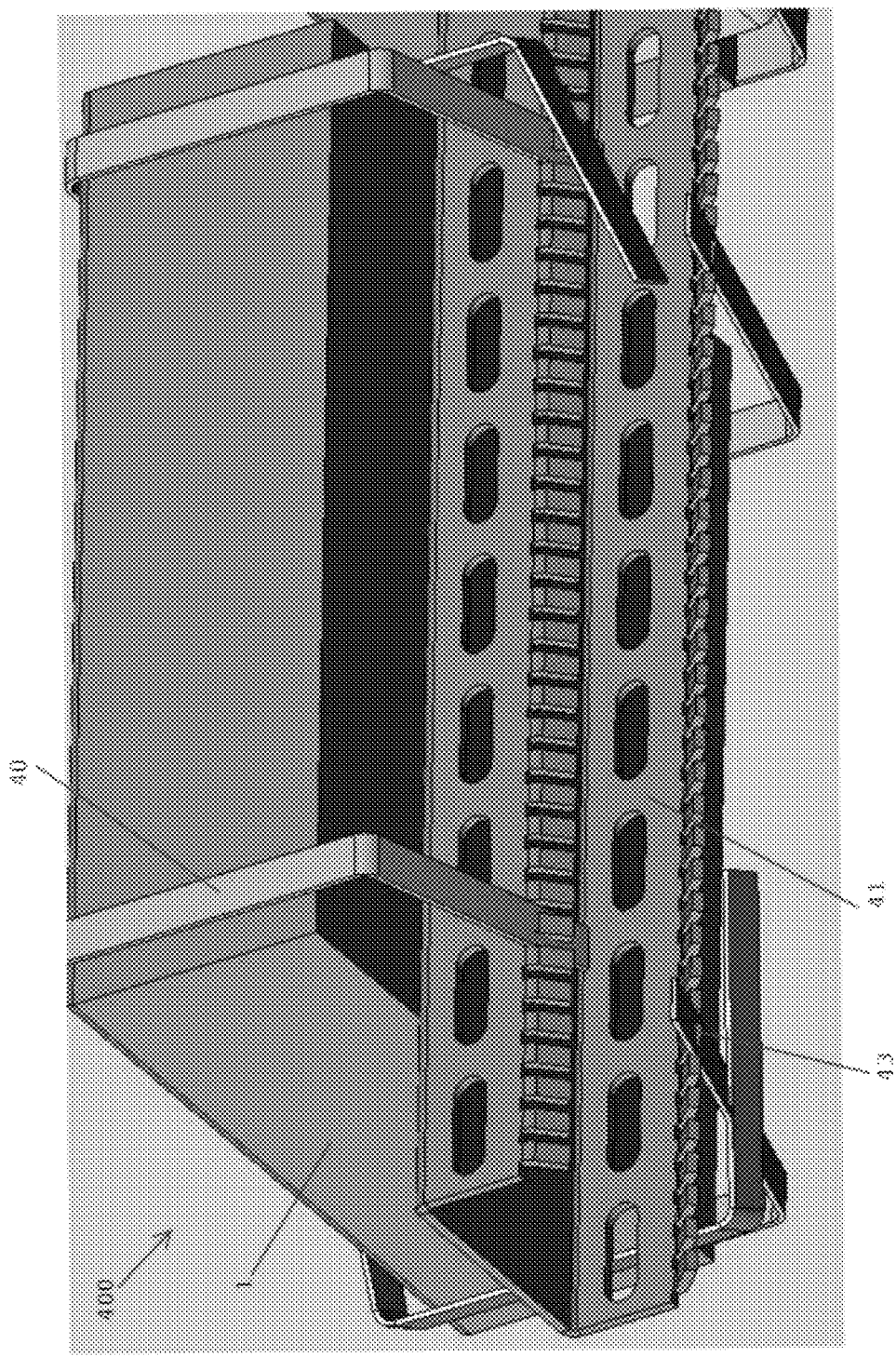

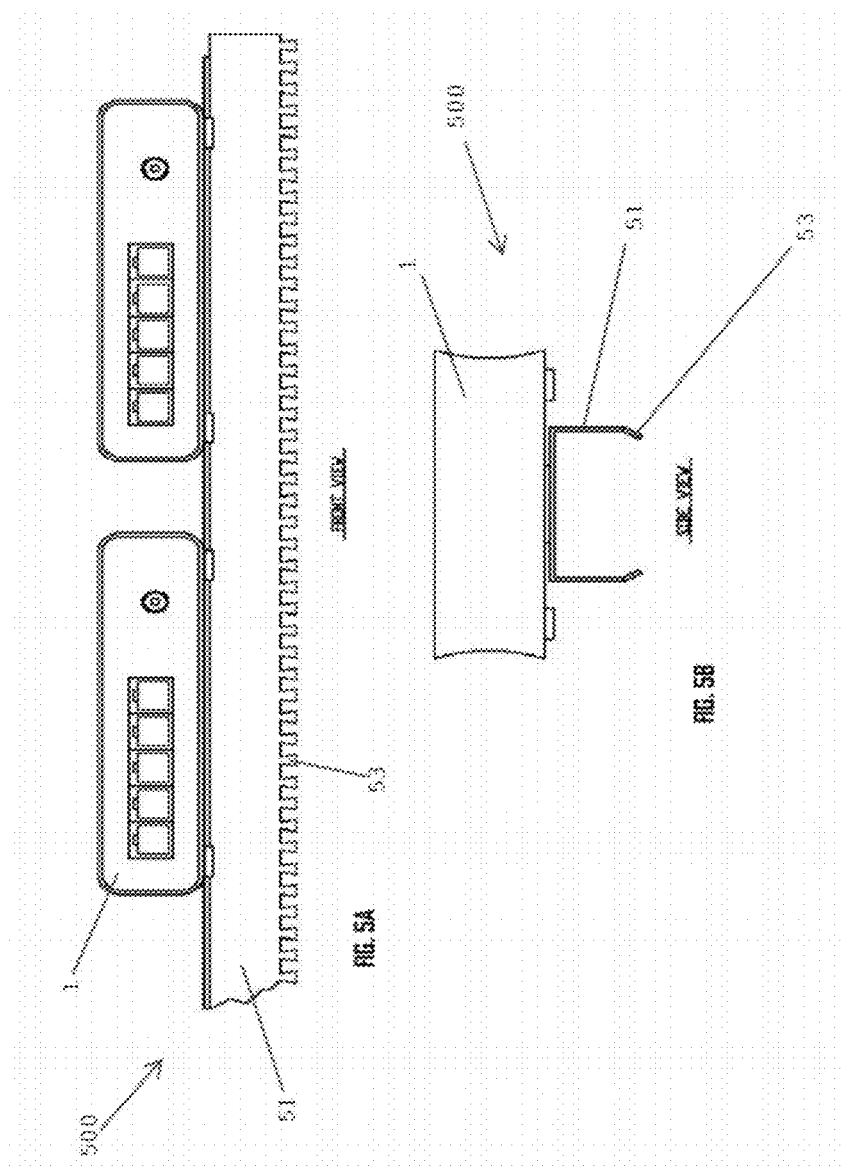

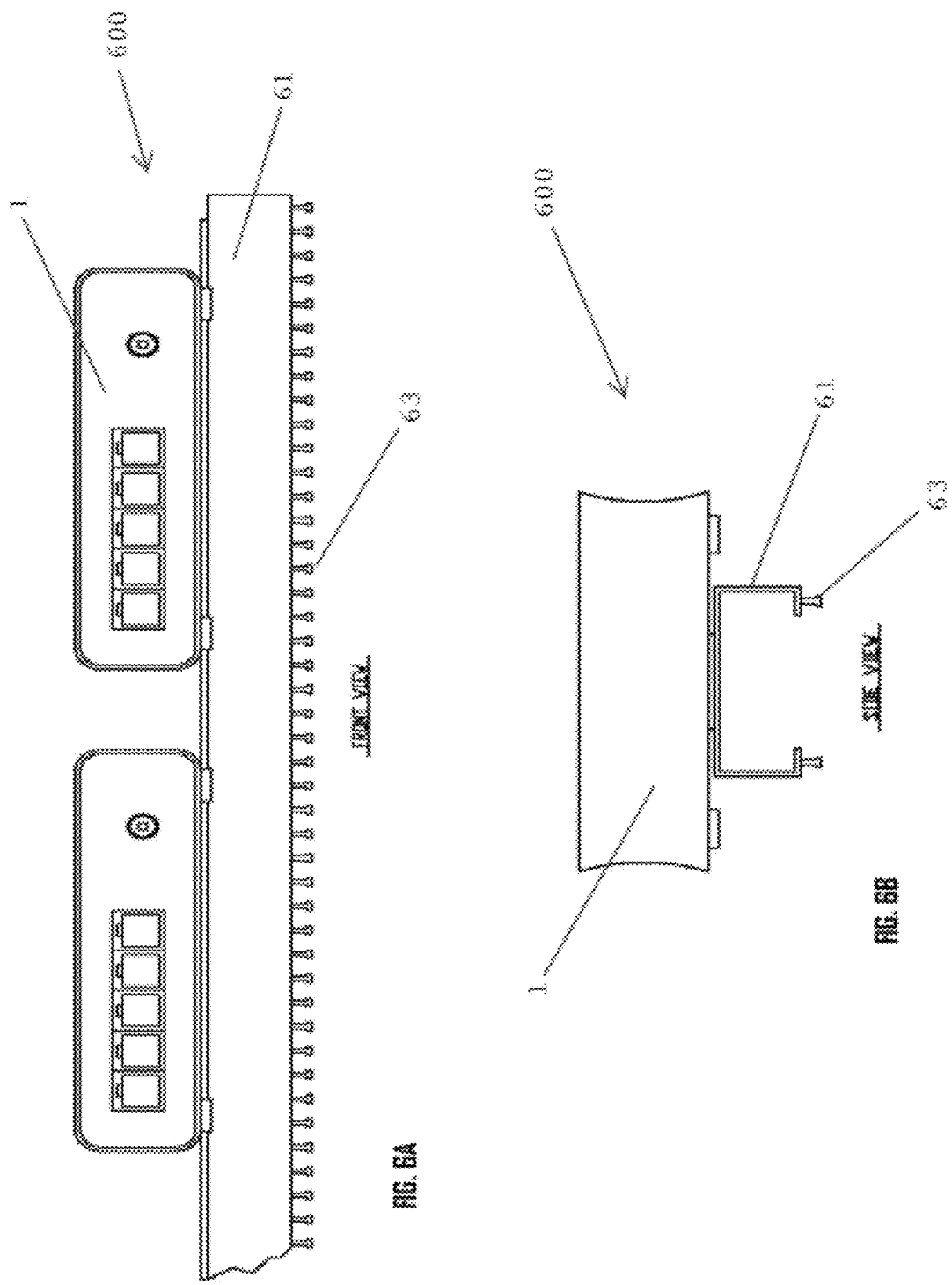

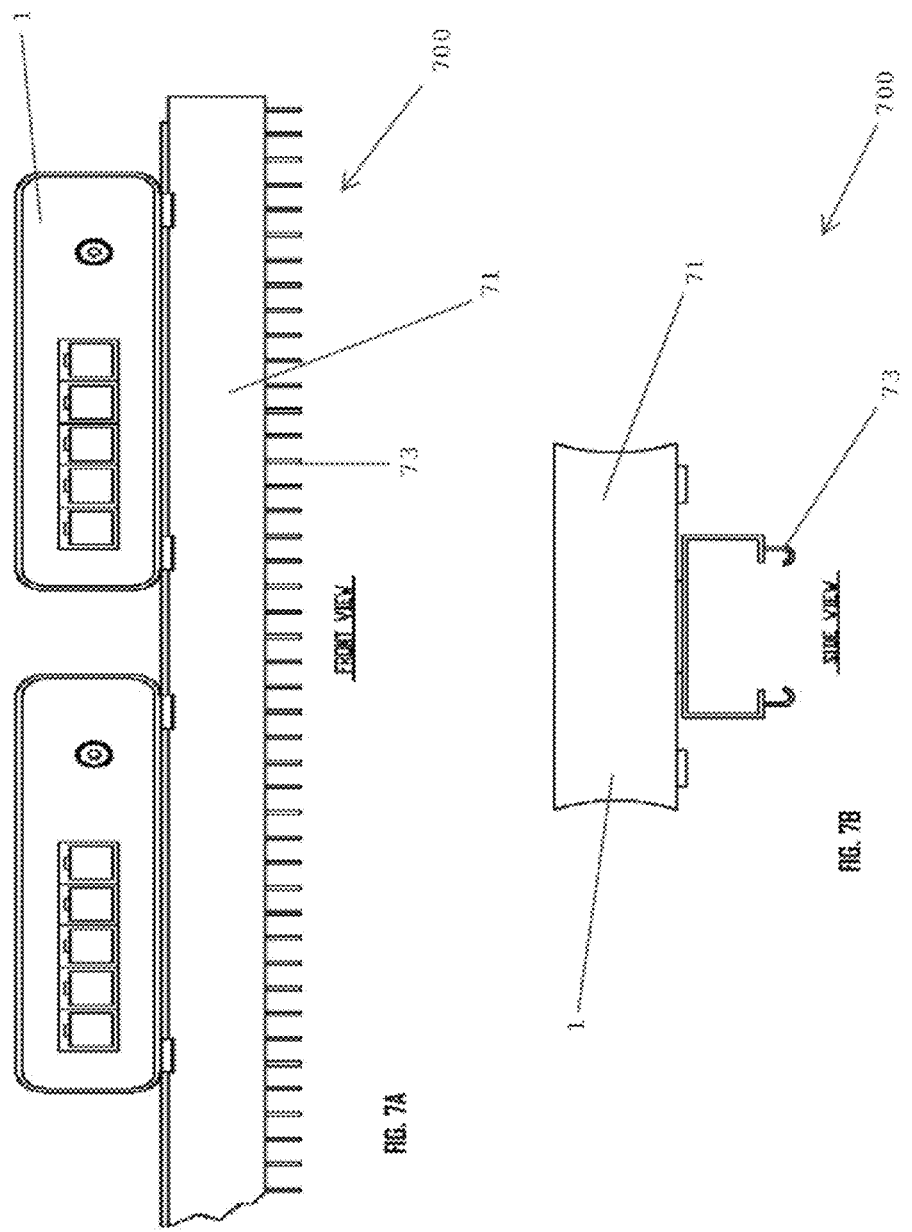

FLEXIBLE MOUNTING SYSTEM FOR ELECTRONIC DEVICES

CROSS-REFERENCE TO RELATED APPLICATIONS

The present application relies on and claims priority to and the benefit of the filing date of U.S. Provisional Patent Application No. 61/438,053, filed Jan. 31, 2011, the entire disclosure of which is hereby incorporated herein by reference.

BACKGROUND OF THE INVENTION

1. Field of the Invention

The present invention is directed to the field of mounting systems used to secure, organize and protect electronic equipment in commercial and industrial settings. More particularly, the present invention relates to methods, systems, and devices for mounting non-uniform components in an organized and easily modifiable structure.

2. Description of Related Art

An equipment rack or other style industrial/commercial electronics enclosure system is typically designed to industry standards to hold electronics equipment specifically designed to those same standards. Commercial electrical components are typically equipped with mounting means on the face of the component for securing the device to a rack. The mounting means most often provides holes that can be lined up with holes on the rack and secured thereto using screws.

With the mushrooming growth of office/home electronics and their improved reliability, commercial electronics systems designers now consider the use of these a suitable and often more functionally flexible or cost effective alternative to industrial/commercial electronic equipment. A major drawback with office/home electronics, however, is that they are invariably offered only in a desktop style case and do not have the required hardware for mounting the component in a commercial rack. Further, there is no provision in the industry standard equipment rack to mount desktop style devices which lack the requisite hardware.

Another issue with using desktop style components in a commercial type rack is that the desktop style components vary considerably in size and geometry. Since the desktop styles are not equipped with mounting means for securing the component to a rack, the components need not be of the same width to fit in the rack. Thus, a basic tenet of desktop component design is to make the component as small as reasonably possible rather than standardizing the shape and size of the component to fit in a standard industry style rack. The industry standard rack and like-designed equipment forces a uniformity of appearance that gives a professional appearance, whereas desktop components of varying size and geometry and mounted in non-standard methods typically do not.

Most desktop cases are made of plastic and are designed to operate in a narrow temperature range consistent with an office/home environment. When equipment is densely mounted in an industrial/commercial equipment rack, the electronics equipment must be engineered to dissipate heat in a manner consistent with the cooling mechanism employed in the rack. Desktop style equipment must be mounted in the cooling air flow with sufficient spacing between devices to prevent cross heating or obstruction of the air flow. Additionally, the mounting means is best when it does not act as an insulating cover over the desktop device.

Industrial/commercial systems designers must find a way to accommodate a wide variety of small electronic devices that were designed for desktop use and lacking industrial mounting facilities. Typical small electronic devices are network interfaces, keyboard/video/mouse extenders, media players, modems, wireless interfaces, etc.

Electronic devices are typically mounted in the following ways: 1) constrained with custom brackets designed for a particular model device, 2) bound with plastic ties to any available protrusion, or 3) adhered to an available surface with adhesive-backed hook and loop tape (Velcro). The first method is expensive to design and has limited usefulness over the lifetime of the enclosure system due to the rapid changes in electronics functionality and geometry. The second method is low cost but does not allow for an engineered mounting, as the electronic component may be mounted without proper concern given for cooling airflow and serviceability. Even if these concerns are addressed, once the plastic ties are cut during servicing there is little chance the component will be remounted in the previous manner. The third method is prone to adhesive failure and is not reusable when the electronic device is replaced.

It is clear from existing technology that a mounting system for small electronic devices and desktop style devices is needed for designers of the industrial/commercial electronic equipment racks to be capable of incorporating desktop-style electronic components in an industrial or commercial environment.

SUMMARY OF THE INVENTION

The present invention provides industrial/commercial systems designers with methods, systems, and devices for incorporating a wide variety of desktop-style small electronic devices, which lack industrial mounting facilities, into industrial or commercial environments or settings. Desktop-style devices include computers, network interfaces, keyboard/video/mouse extenders, media players, modems, wireless interfaces, and any other electronic device typically used in a commercial office or residential setting.

Even though embodiments of the invention can be used with electronics components comprising built-in means for securing the devices to standard electronics-supporting racks, such as brackets with screw holes for screwing the brackets to a rack, especially preferred are such components lacking this industrial/commercial facility.

More particularly, embodiments of the present invention include methods, systems, and devices for mounting, securing, and/or supporting one or more electronic device to a rigid support using a mesh-type securing means, wherein the securing means and support are operably configured for releasable engagement with one another.

Specific embodiments include mounting systems for electronics components comprising: a) one or more flexible and elastic plastic mesh securing members; and b) one or more elongated support bars comprising: (i) a planar upper support member; (ii) opposing anterior and posterior flanges disposed at right angles to the upper support member; and (iii) a plurality of protrusions integral to or fixedly connected to the flanges which are operably configured for releasable engagement with the mesh.

Preferred are embodiments are capable of being implemented without altering, modifying, or otherwise damaging or modifying the case of the electronic component being secured to the support bar or rack.

The mounting systems of the invention can be installed in typical equipment enclosures much in the same way larger industry-standard mounting components are installed. This means that space can be pre-planned and allocated for the small electronic devices. In this way cooling airflow and cable routing to the small electronic devices becomes predicable and repeatable. Mounting small electronic devices near related equipment reduces cable lengths which reduces installation labor.

Preferred mounting systems for electronics components according to embodiments of the invention comprise: a) one or more flexible and elastic plastic mesh securing member; and b) an elongated C- or U-shaped support bar comprising: an upper support surface having a width that is 5-25% of its length; opposing anterior and posterior flanges each with a surface disposed from 30-150° relative to and below the upper support surface; and one or more protrusions integral to or fixedly connected directly or indirectly to the opposing anterior and posterior flanges and operably configured for releasable engagement with the mesh.

Such mounting systems can have mesh with one or more voids with a honeycomb, square, circular, oval, hexagon, pentagon, rectangular, diamond, or triangular shape. In embodiments, about 5-10% of the mesh is material and not voids.

The mesh in mounting systems and rack systems of the invention can have an elasticity measured by stretching of the mesh fabric, or material from which it is made, up to 450% in length without breakage and resiliency measured by returning the fabric or material to its original shape after stretching up to 450% in length. For example, the mesh can have an elasticity characterized by stretching up to 150% in length without breakage and resiliency characterized by returning the mesh or material to its original shape after stretching up to 150% in length.

Systems of the invention can have an upper support member or surface with a width that is 5-10% of its length.

The support bar can be U-shaped and the opposing anterior and posterior flanges are disposed at right angles to the upper support member or surface. Even further, the mounting systems can have a support bar that is C-shaped and flanges that are L-shaped. In such embodiments, the overall shape of the support bar is U-shaped (upper support surface and first surface of the flanges together comprise the U-shape), then the L-shaped flanges add additional structure to obtain a C-shaped member.

Mounting systems can also be configured such that one or more of the flanges are adjustable relative to the support bar, or one or more of the protrusions are adjustable relative to the flanges, or both the flanges and protrusions are adjustable. In preferred embodiments, the flanges and/or protrusions can be bent into a desired position relative respectively to the support bar or flanges, or can be rotated into a desired fixed position, or can be hinged.

The mounting systems of embodiments can comprise a plurality of protrusions disposed lengthwise along the flanges from 5-25 protrusions per inch.

Preferred are mounting systems, wherein the support bar, flanges, and protrusions are integral with one another and are formed from a single sheet of metal. The mounting systems can also have L-shaped flanges with a plurality of protrusions that are molded hooks disposed in the L-shaped flanges. Specifically, the mounting systems can comprise molded hooks with screw-type means and flanges that comprise threaded openings for receiving the screw-type means of the hooks.

One or more protrusions can be molded hooks castellated in shape. Not all of the protrusions must be of the same shape and size. In preferred embodiments, a variety of protrusion types and sizes are provided along the length of the flanges.

The mounting systems can also comprise L-shaped flanges and a plurality of protrusions that are wire hooks disposed in the L-shaped flanges. Typically, the hooks or protrusions can be connected to the flanges at a right angle relative thereto or can be connected at any angle that facilitates securing of the mesh to the protrusions during use. Similarly, the mounting systems can comprise wire hooks with screw-type means and flanges with threaded openings for receiving the screw-type means of the hooks.

Also included in the scope of the invention are rack systems for mounting electronics components comprising: a) two rails configured for attachment to one or more support bars; b) one or more flexible and elastic plastic mesh securing member; and c) an elongated C- or U-shaped support bar configured for attachment to the two rails and comprising: an upper support surface having a width that is 5-25% of its length; opposing anterior and posterior flanges each with a surface disposed from 30-150° relative to and below the upper support surface; and one or more protrusions integral to or fixedly connected directly or indirectly to the opposing anterior and posterior flanges and operably configured for releasable engagement with the mesh.

Such rack systems and mounting systems can comprise rails and the elongated C- or U-shaped support bars with through holes along their length for securing the support bars in any number of positions on the rails in the rack system. Screws are the preferred means for attaching the support bars to the rails but any equivalent securing means, such as rivets, soldering, or nuts/bolts can be used.

Rack systems can preferably comprise mesh with an elasticity measured by stretching up to 150% in length without breakage and resiliency measured by returning to its original shape after stretching up to 150% in length. The voids in the mesh of the systems according to the invention can have any shape, including one or more void that is honeycomb, square, circular, oval, hexagon, pentagon, rectangular, diamond, or triangular shaped. The mesh sheet when laid out on a surface occupies an area defined by its length and width, and in embodiments about 5-10% of the area that the mesh occupies is material or webbing and not voids.

Methods of installing electronics components into a standard rack system are also encompassed by the present invention. More particularly, methods for installing any of the specific systems described in this specification are part of the invention. For example, methods comprising installing one or more flexible and elastic plastic mesh securing members around a desktop style or commercial electronics component disposed on one or more elongated support bars are included in the invention. Such methods can comprise installing one or more components on a support bar that is configured to comprise: (i) a planar upper support member; (ii) opposing anterior and posterior flanges disposed at right angles to the upper support member; and (iii) a plurality of protrusions integral to or fixedly connected to the flanges which are operably configured for releasable engagement with the mesh. Installation for operation and/or for transporting or shipping components to a desired location are some examples of how the methods, systems, and devices of the invention can be used. The mesh securing member is ideally suited for installing electronics components into racks to stabilize the cargo during shipping, since the mesh can be quickly and effortlessly employed around the component and secured to the support bar, then quickly and effortlessly released when the cargo is ready to be unloaded.

Any combination of features of the mounting system and/or the rack system of embodiments described in this specification can be used together or separately to obtain similar systems. It is not critical that certain features are described relative to specific embodiments and it is understood that the features are optional and/or interchangeable from embodiment to embodiment. In particular, when referring to a mounting system of the invention, it is understood that the mounting systems can be a component of the rack systems, and when referring to the rack systems, it is understood that various components of the rack systems may be omitted, such as the rails, to obtain a mounting system of the invention.

These and other aspects of the present invention will be more apparent from the following description. The features and advantages of the present invention will be apparent to those skilled in the art. While numerous changes may be made by those skilled in the art, such changes are within the spirit of the invention.

BRIEF DESCRIPTION OF THE DRAWINGS

These drawings illustrate certain aspects of some of the embodiments of the present invention, and should not be used to limit or define the invention. For clarity in all 3D figures, the mesh is depicted as a solid sheet rather than an open weave mesh.

FIG. 3 is a schematic diagram showing a top perspective view of the embodiment shown in FIG. 2 highlighting the two styles of mesh, which provide (left) a single sheet of material cut to fit the device and (right) three mesh strips cut to appropriate length.

FIG. 4 is a schematic diagram showing a bottom perspective view of a mounting system according to embodiments of the invention illustrating one electronic device mounted on a single rigid support and secured with strips of flexible material connecting to hooks formed into the bottom edges of the rigid support.

FIGS. 5A and 5B are schematic diagrams showing respectively front and side elevation views of electronic devices which can be secured to a rigid support using flexible mounting means (not shown) in combination with corresponding molded hooks on the rigid support operably configured for releasable engagement with one another.

FIGS. 6A and 6B are schematic diagrams showing respectively front and side elevation views of electronic devices capable of being secured to a rigid support using a hook and loop type securing means comprising a mesh mounting means in combination with corresponding pins integral to or inserted into the rigid support.

FIGS. 7A and 7B are schematic diagrams showing respectively front and side elevation views of electronic devices which can be secured to a rigid support operably configured for releasable engagement with mesh-type securing means, wherein the rigid support comprises wire hooks implemented with bonded formed wire.

DETAILED DESCRIPTION OF VARIOUS EMBODIMENTS OF THE INVENTION

Embodiments of the invention include devices and systems comprising a rigid support with hooks, and netting. These two components provide an arrangement that accommodates the fixed mounting of various size and shape electronic devices.

Very generally, like a shelf, the rigid support holds the weight of the electronic device but is narrower than a shelf such that the device would not remain in place unless held by the netting. For example, support bars that have a width that is approximately 5-95% of their length are preferred, such as a rigid support member having a width in the range of about 10-90% of its length, or from about 20-75% of its length, or from about 30-50% of its length. Preferred are support bars having a width that is 5-25% of its length. The top (upper support surface) of the rigid support member can be covered with a non-skid material to prevent the electronic components disposed thereon from sliding relative to the rigid support. The netting or mesh is a generally flat plastic molded mesh sheet and can either be cut to loosely match the geometry of the electronic device or cut into narrow strips.

In methods according to embodiments of the invention, the netting can be laid over or otherwise disposed on the electronic device to be mounted to the rigid support. Once properly positioned, the mesh can be wrapped around the device and under the support bar where it is secured on structure integral to or connected with the rigid support, such as hooks formed into the bottom side of the rigid support. In such a releasable engaging manner, the netting can be easily unhooked and repositioned again for servicing or adjusting the location of the electronic device relative to other devices installed on the same rigid support.

Figure 1:
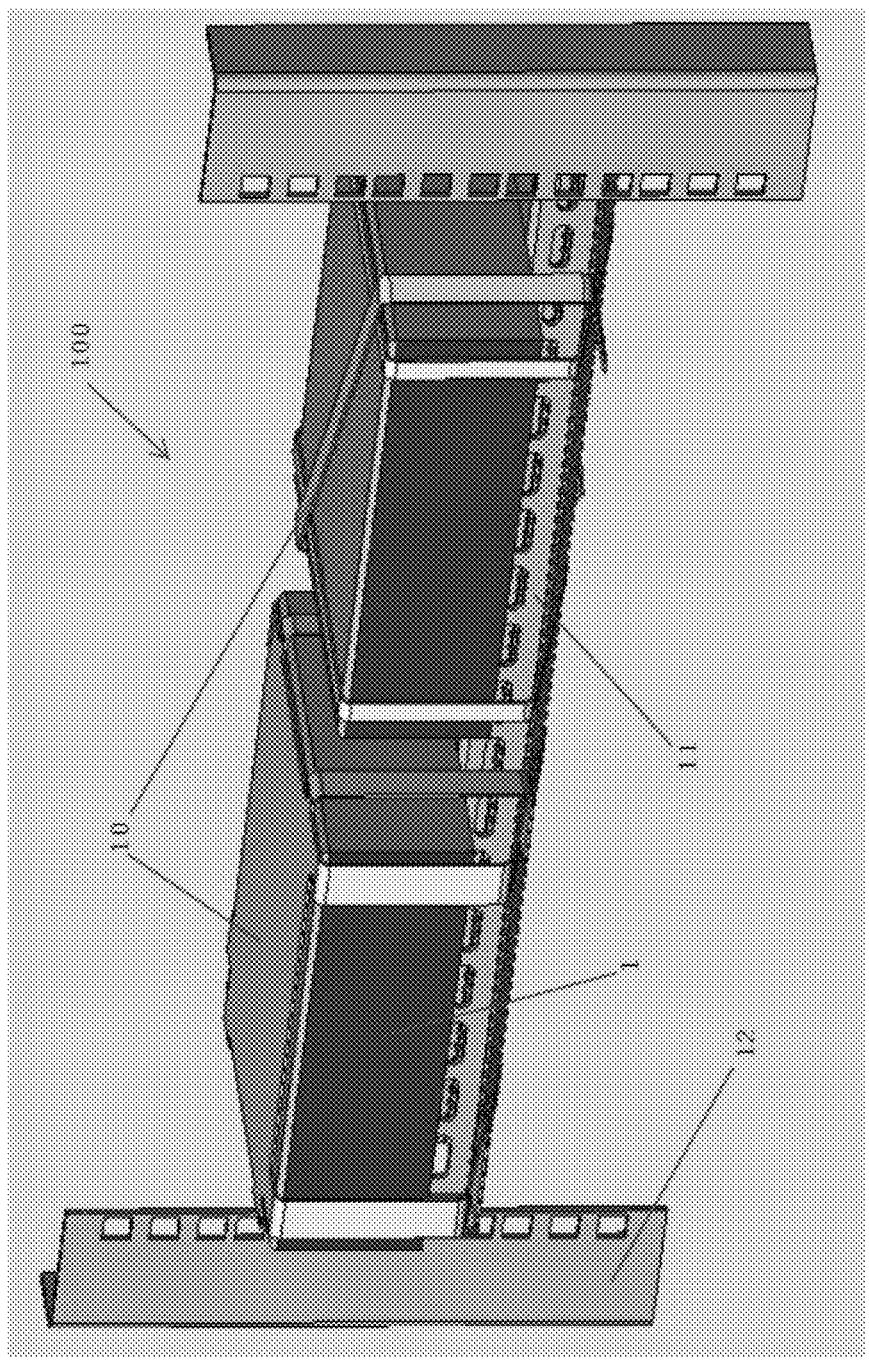
FIG. 1 is a schematic diagram of a mounting system embodiment of the invention showing two electronic devices mounted on a single rigid support bar with two styles of mesh type securing means shown in an EIA standard rack.

FIG. 1 is a schematic diagram of a mounting system of an embodiment of the invention showing two small electronic desktop style devices mounted on a single rigid support bar with two styles of mesh securing means shown in an EIA standard rack. The rigid support includes a means for mounting the support bar to industry standard equipment racks, such as rails. This means can be either formed into the basic shape of the rigid support or additional brackets that interface the rigid support to the rack. As shown, the means for securing the rigid support member to the rack is a plurality of through holes disposed lengthwise in the anterior and posterior flanges of the support bar. In this manner, screws can be used to secure the support bar to the rack through the holes in the support bar.

In embodiments, the rigid support is narrower than a nominal small electronic device and the plastic netting is open weave. This combination minimizes the restriction of airflow around the electronic device, which assures the maximum cooling of the device. This is also advantageous in that cooling airflow to adjacent components is minimally affected by the mounting system.

More particularly, as provided in FIG. 1, mounting systems 100 and devices of embodiments of the invention can comprise one or more flexible securing means 10 and a rigid support 11, which are operably configured for releasable engagement with one another. Typically, the rigid support member 11 is an electronics device support capable of being used in a standard rack system. In such electronics rack systems, the rigid support 11 can be installed on side rails 12 in any number of multiple positions. Here one or more through-holes are disposed in the rigid support 11 in a manner to allow for interfacing the support with rails 12 in the industry standard rack. For example, the through-holes in support bar 11 can be aligned with through-holes of rail 12 and the support and rail secured together using screws disposed in the through-holes. By securing the equipment 1 to the support bar 11 with a mesh-type material 10, any device made for non-commercial and/or non-industrial uses can be incorporated into the rack system without altering the electronics device 1.

In contrast, without the benefit of the invention, such devices would require attaching adhesive hook and loop type fasteners (such as Velcro) and/or brackets to the surface of the electronics component for securing the component to the support and/or rail(s).

In embodiments, the flexible securing means 10 can comprise a mesh sheet material having an open network texture. Such an open network renders the material capable of being engaged with corresponding structure of the rigid support 11. The mesh can be prepared in any number of ways, including a knit, woven, cast, linked, molded, or knotted fabric, metal, plastic, or rubber to name a few. Preferably, the mesh or netting is a plastic which is capable of resisting deformation or melting when exposed to temperatures associated with typical and/or expected heat outputs of electronic devices. Another preferred feature of the mesh is that it is flexible, conforms to the shape of the electronic device with which it is used, and is to some extent elastic. Especially preferred are mesh materials capable of gripping the electronic device, such as a coated plastic or a rubber-type mesh. Thermoplastic materials are also preferred such that the mesh material can withstand the higher temperature environment often associated with an industrial electronics component storage setting.

The network of the mesh can be uniform or non-uniform, can have small voids or large voids in combination with a wide or narrow structural network. The variations in mesh are unlimited so long as the mesh is capable of releasable engagement with corresponding structure of the rigid support member and is capable of securing an electronic device to the rigid support without adhesives or altering the surface of the electronic device itself. The mesh pattern need not be consistent throughout the sheet of material and for example can comprise straps that are not of a mesh type configuration. The straps in such an embodiment can comprise one or more holes for attaching the straps to protrusions on the support bar or can be made of a material capable of being stretched over such protrusions in a manner to punch a hole in the material for securing it to the support bar.

Figure 8A:
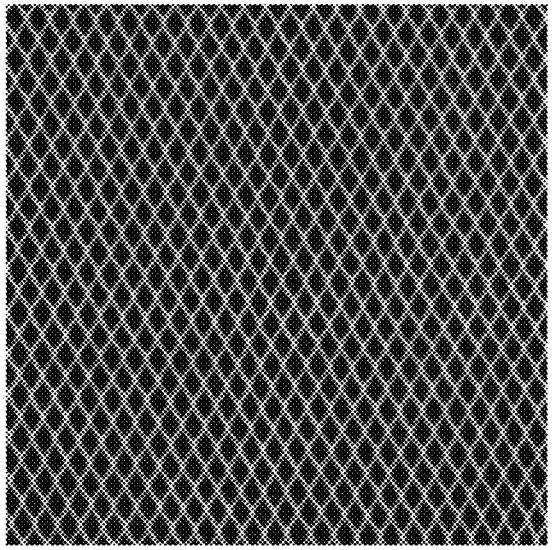
FIGS. 8A-Z and FIGS. 8AA-8DD are photos of various types of flexible material or mesh-type webbing that can be used in the flexible mounting systems.
Figure 8B:
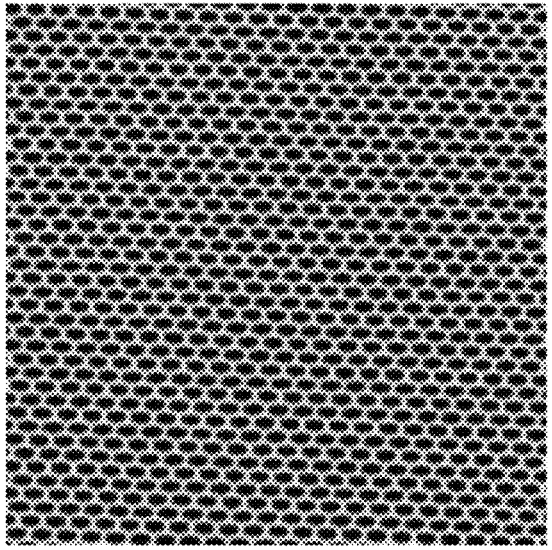
Figure 8C:
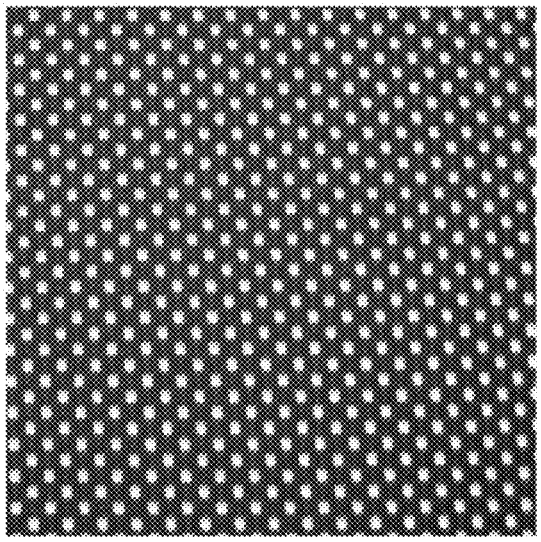
Figure 8D:
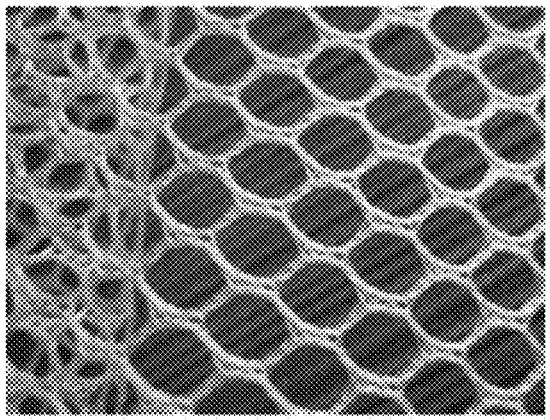
Figure 8E:
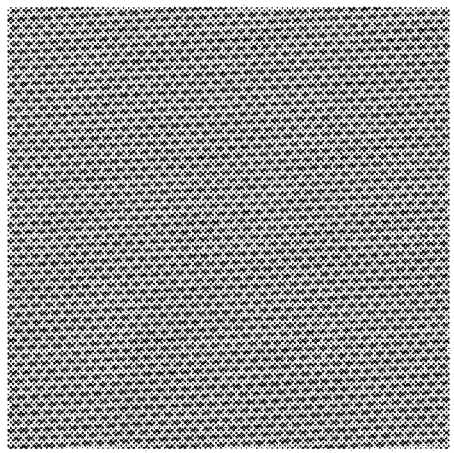
Figure 8F:
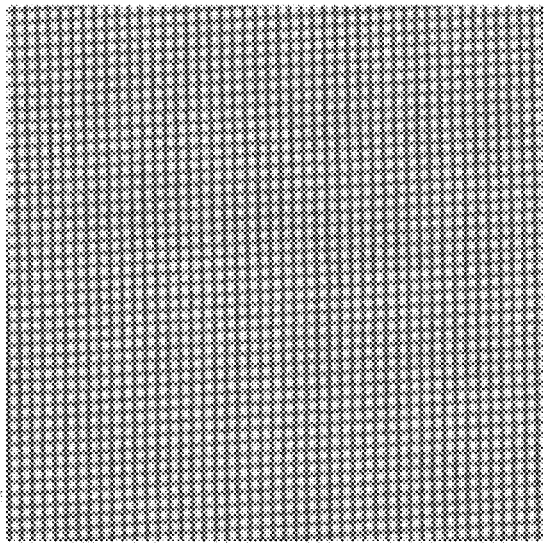
Figure 8G:
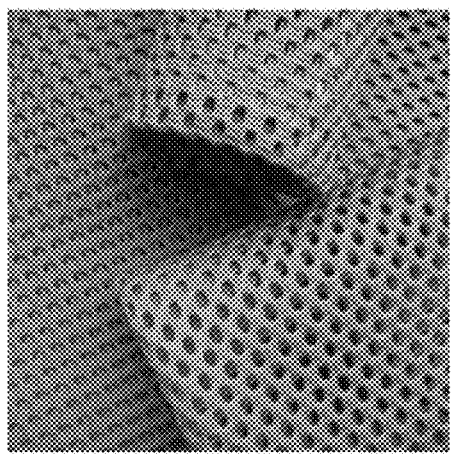
Figure 8H:
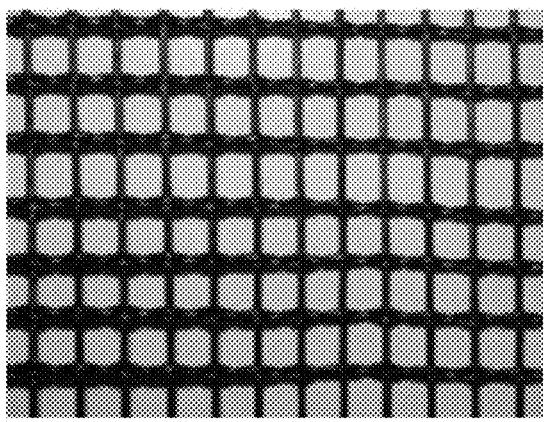
Figure 8I:
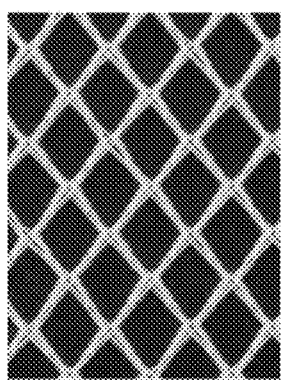
Figure 8J:
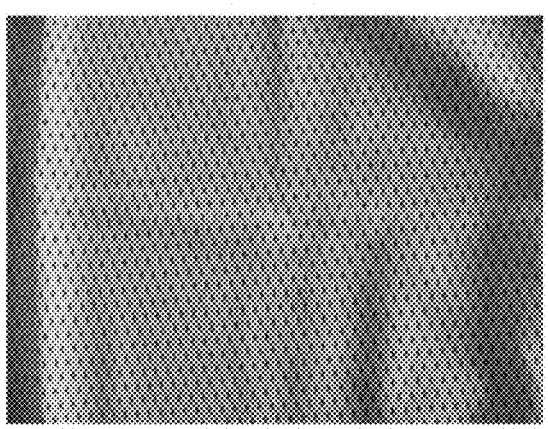
Figure 8K:
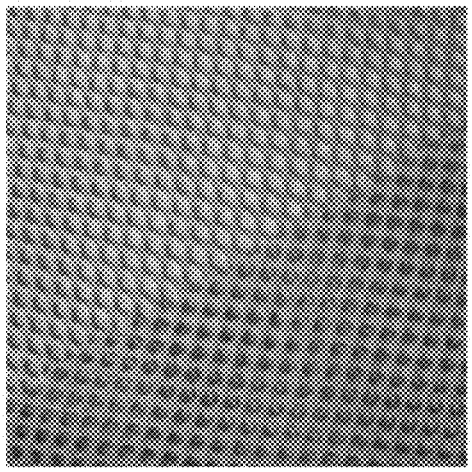
Figure 8L:
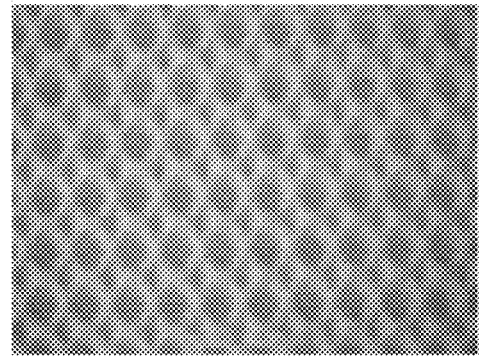
Figure 8M:
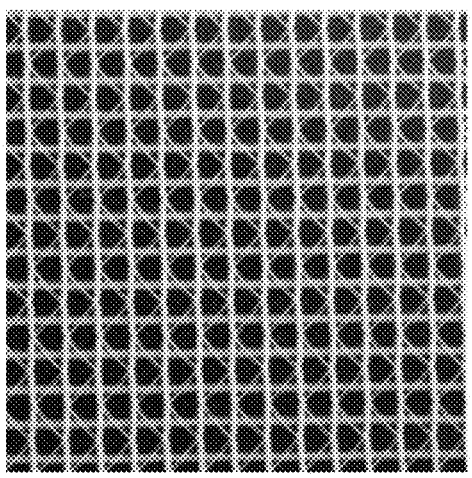
Figure 8N:
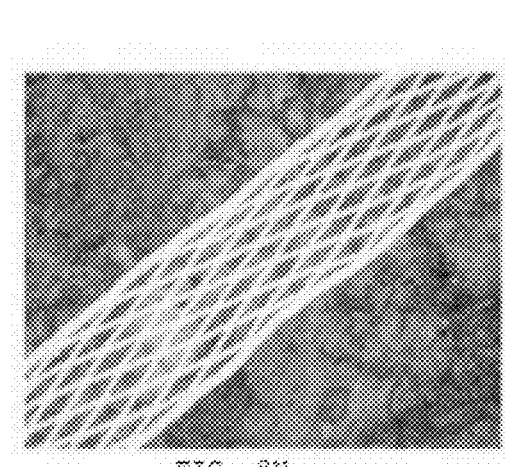
Figure 8O:
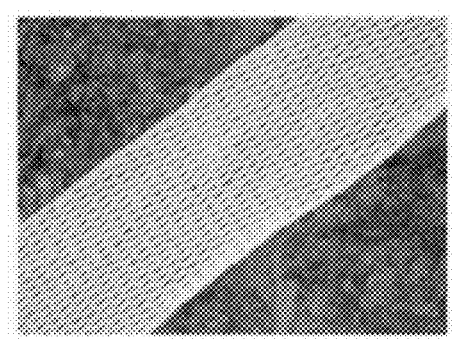
Figure 8P:
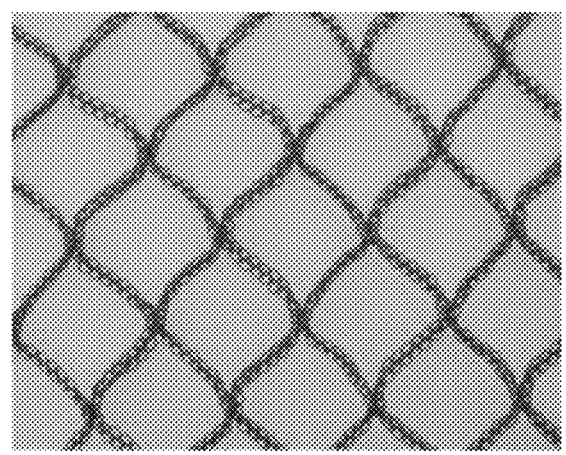
Figure 8Q:
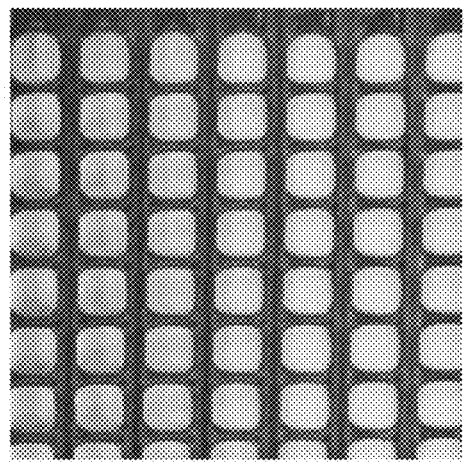
Figure 8R:
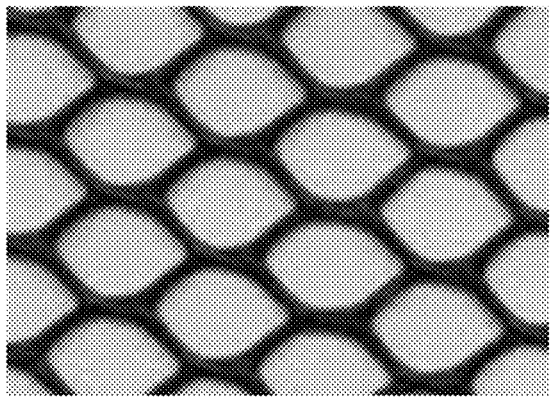
Figure 8S:
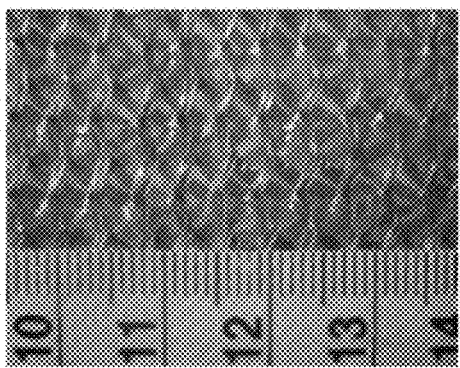
Figure 8T:
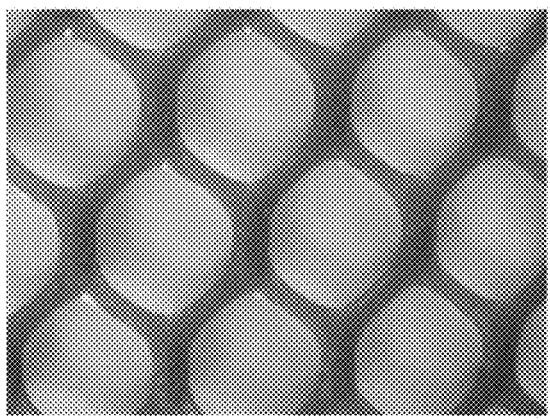
Figure 8U:
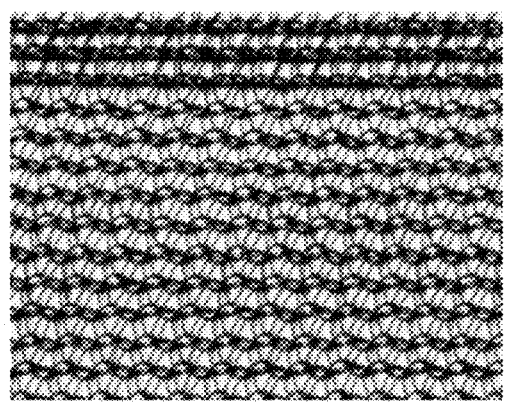
Figure 8V:
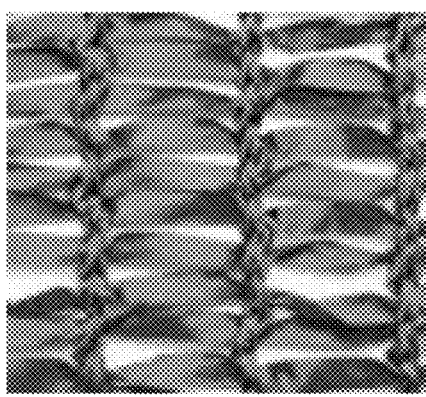
Figure 8X:
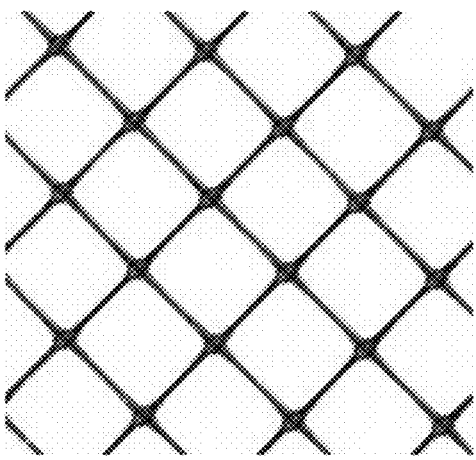
Figure 8X:
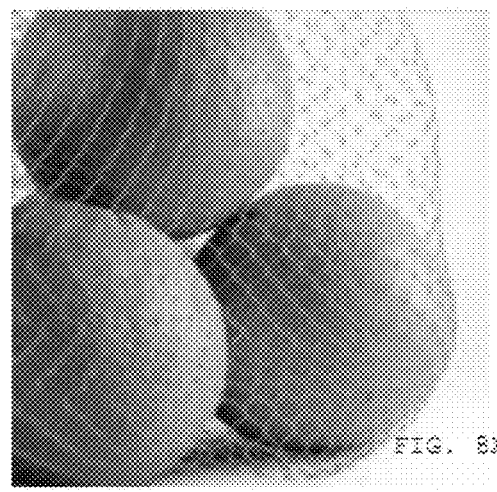
Figure 8Y:
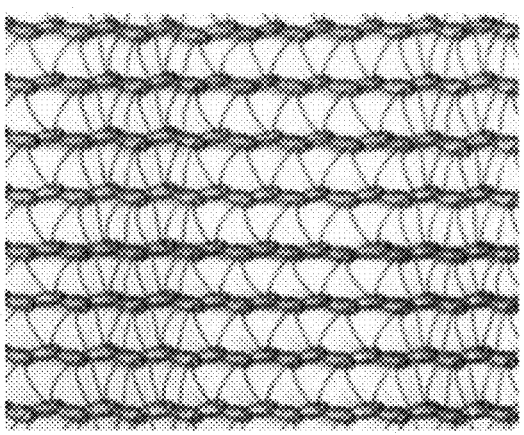
Figure 8Z:
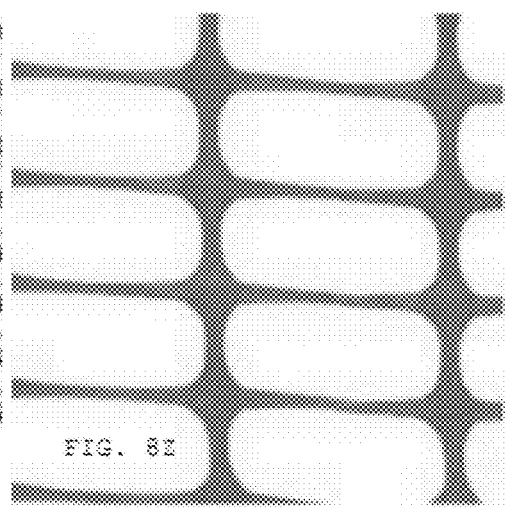
Figure 8A:
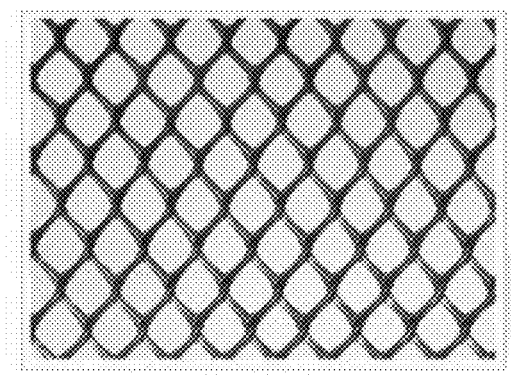
Figure 8B:
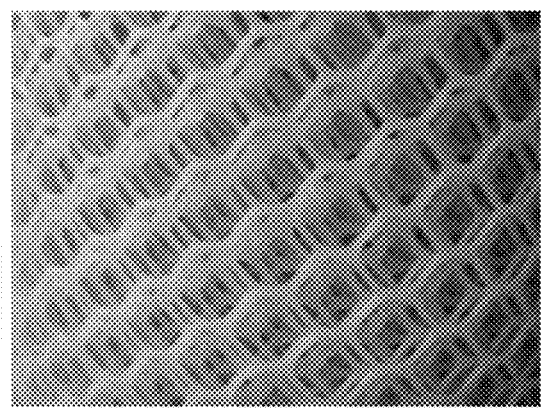
Figure 8C:
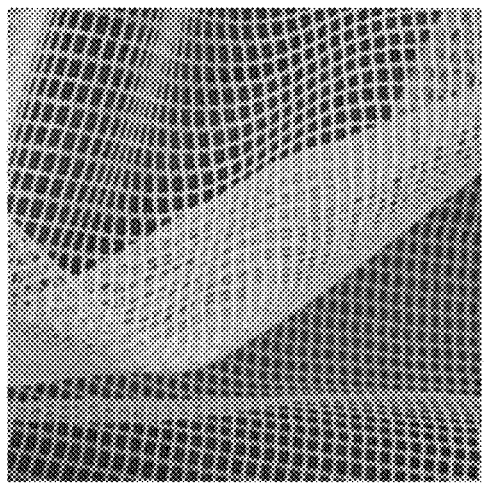
Figure 8D:
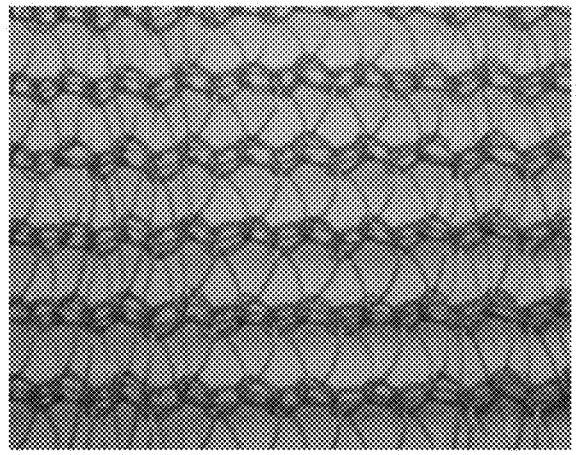

Exemplary styles of mesh network capable of being used for the mesh securing means 10 are provided in FIGS. 8A-Z and 8AA-8DD. Preferred materials include for example polypropylene plastic or EDPM rubber. Specific types of materials that can be used include any plastic or rubber composition, especially those capable of tolerating high heat conditions without failing. Thermoplastic EPDM (ethylene propylene diene terpolymer) is one example. The mesh materials can have a tensile strength (ASTM D 412) of at least 1300 psi, such as about 1650 psi; and/or an elongation to break (ASTM D 412) of at least about 300%, such as 480%; and/or a minimum tear strength (ASTM D 624-Die C) of about 150 lb/in, such as 200 lb/in, such as for uncured EPDM rubber. For cured EPDM rubber, a minimum tensile strength (ASTM D 412-Die C) of 1305 psi is desired; and/or a minimum elongation to break of about 300%; and/or a minimum tear resistance of 150 lbs/in (D-624 Die C) is desired. Any combination of one or more of these characteristics can be used.

Neoprene (cured or uncured) can also be used for the mesh material. If uncured and before vulcanization preferred Neoprene has a modulus, 100%, about 25-75 psi (ASTM D 412-Die C); and/or an ultimate elongation (ASTM D 412-Die C) of at least 400%. After vulcanization, Neoprene type materials can have a tensile strength (ASTM D 412-Die C) of about 1484 PSI; and/or an elongation of about 267%; and/or a tear resistance (ASTM D412-Die C) of about 171 lbs/in., or higher.

Mesh material according to the invention can also comprise thermoplastic olefin (TPO). Such material can have an elongation (ASTM D 412) of about 500%; and/or a tearing strength (ASTM D 751) of at least 55 lpf (245 N), such as 156 lpf (694 N), or 120 lpf (530 N); and/or a water absorption of less than about 8%, such as 4%, or 2%, or 0.1%.

Other materials that can be used include ethylene vinyl acetate and PVC terpolymer thermoplastic, or polypropylene, such as APP (Atactic Polypropylene).

Preferred materials include those that can be exposed to temperatures ranging from −60 F. to +270 F. without failure. Preferred materials can have a melting point of about 200°, or 350° F. or higher. Heat weldable products are also a possibility.

Further, for example, the mesh can provide honeycomb, square, circular, oval, hexagon, pentagon, rectangular, diamond, or triangular openings or voids. The amount of solid material comprising the network structure of the mesh can cover the same amount of area as the voids in the mesh, or can cover less area or more. The amount of solid material needed for particular applications will depend on the type and strength of the material used. The type of material, the type of mesh, and the overall configuration of the securing member can be varied to suit particular applications.

In preferred embodiments, the surface area of the mesh can comprise from 1-100% of material, while the remainder constitutes voids. For example, the mesh can comprise from 2% to 10% material, or from 3% to 15% material, or from 4% to 20% material, or from 5% to 16%, or from 6% to 9%, or from 7% to 11%, or from 8% to 25% material, or from 12% to 30% material, such as from 18% to 28% material, or from 35% to 50% material, or from 45% to 55% material, or from 40 to 75% material, such as from 52% to 65% material, or from 60% to 80% material, or from 70% to 90% material, or from 85% to 95% material, or from 88% to 100% material, with the remainder or no portion thereof as voids. Surface area in this context can refer to the material in a resting positing or in a stretched position. Surface area in this context can also refer to the overall area that the mesh sheet occupies. For example, a portion of mesh material that measures 10 inches by 10 inches can have up to 100 in$^2$ in possible surface area with no voids. With voids, there is preferably from 1-99 in$^2$ of material present. With a large amount of voids, there can be, e.g., about 5% or 5 in$^2$ of material or with a small amount of voids, there can be, e.g., about 98% or 98 in$^2$ of material in the mesh sheet.

The mesh 10 is preferably elastic and flexible. The flexibility of the mesh material is characterized by having the ability to be folded, bent, rolled or likewise manipulated without permanently creasing the material and with the ability to return to its original shape. The configuration and structure of the mesh can contribute to its flexibility, resiliency, and elasticity. The mesh can comprise a material that can be stretched up to 450% and then return to its original length. Preferred mesh or the material from which it is comprised has an elongation to break of greater than 450%. In embodiments, the mesh can be stretched from 1% to 450% of its length or width, then returned to its original length or width. For example, the mesh can be stretched from 5% to 300%, or from 10% to 200%, or from 15% to 150%, or from 20% to 100%, or from 25% to 90%, or from 30% to 80%, or from 40% to 75%, or from 50% to 60% of its length or width then returned to its original size. The mesh is also a resilient material.

The mounting system 100 can be installed in any part of a standard equipment enclosure in the same way larger industry-standard mounting components are installed. This means that space can be pre-planned and allocated for the small electronic devices. In this way cooling airflow and cable routing to the small electronic devices becomes predicable and repeatable. Small electronic devices can now be mounted near related equipment to reduce cable lengths.

Figure 2:
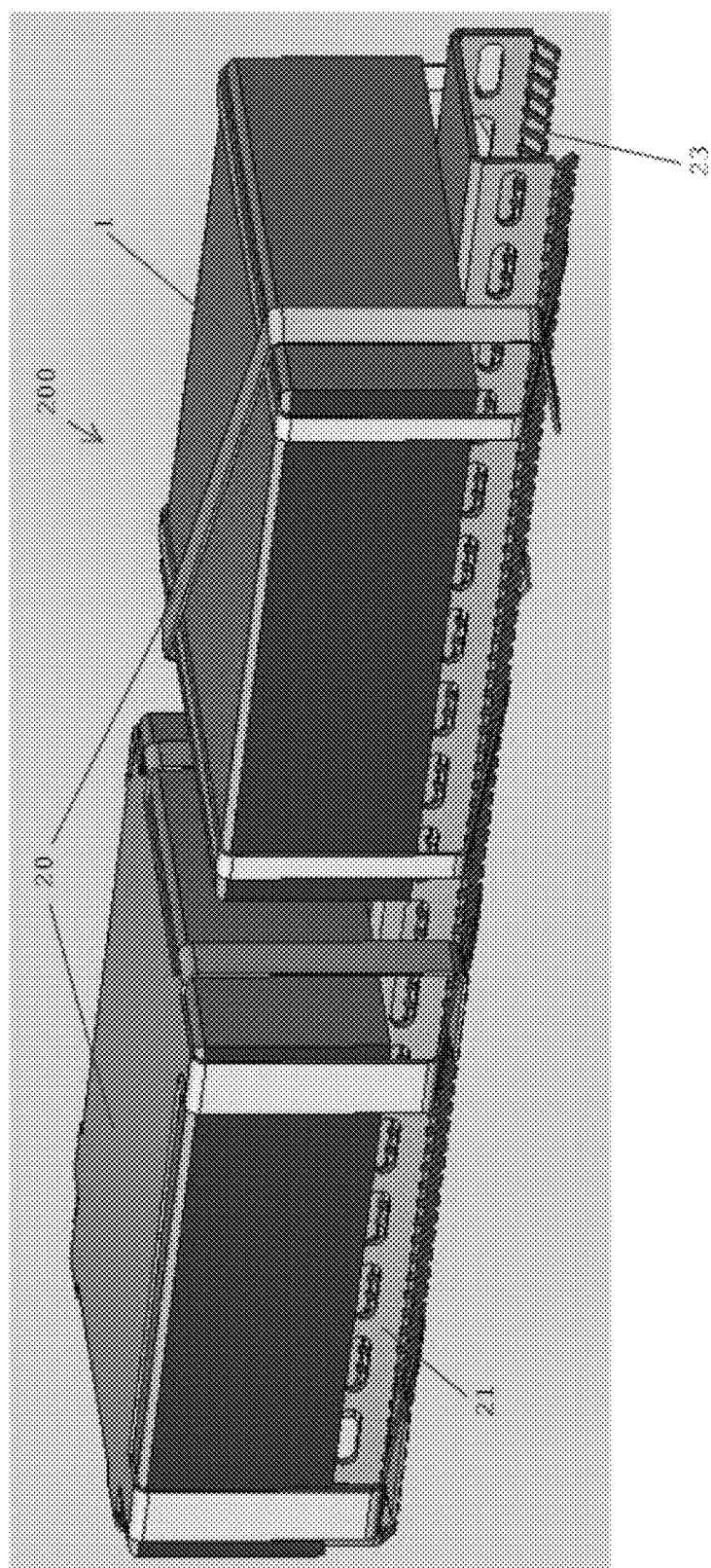
FIG. 2 is a schematic diagram of a mounting system embodiment of the present invention illustrating two small electronic devices mounted on a single rigid support using two styles of mesh.

FIG. 2 illustrates a system embodiment 200 of the invention without the rack on which the rigid support 21 is secured. The mesh securing means 20 can be cut, formed, or otherwise shaped to secure specific types of electronics 1 to support bar 21. One advantage to open weave netting, is that the voids allow for visibility to indicators behind the netting. The netting can also be cut to avoid interfering with connectors, switches or other protrusions. Preferably, the plastic mesh netting can be cut with scissors to tailor the netting to the device. In this way, a service technician can modify the mesh if needed when replacing a small electronic device. For large quantity installations, the plastic mesh can be die cut.

As illustrated in FIG. 2, the electronic device 1 on the left of rigid support 21 is secured to the support bar using a mesh securing means operably configured for releasable engagement with corresponding structure 23 of the support 21. The mesh 20 material used to secure the equipment on the left is configured or cut to comprise a substantially planar sheet of material for conforming to and securing the top of the equipment 1, while several strips of mesh material wrap around the sides of the device 1. In this manner, the strips of mesh material as well as the mesh material itself can be stretched to impart a desired amount of tension over and around the surface of the equipment 1 being secured to the support 21 and then engaged with one or more protrusions 23 integral to the support member 21.

As shown, the support member 21, can comprise opposing anterior and posterior flanges disposed at right angles to the upper support surface. Each of the anterior and posterior flanges preferably comprises through holes for securing the support bar to an industry standard rack. Further, a plurality of protrusions integral to or fixedly connected to the support bar are operably configured for releasable engagement with the mesh. The protrusions can be cut out from the anterior and posterior flanges, as shown, or fixedly connected to the support bar in any number of ways, as shown below. The protrusions 23 can be disposed in the same plane as the anterior and posterior flanges, or can be disposed at an angle relative to those surfaces. As shown, the protrusions 23 are integral to the anterior and posterior flanges and are bent at about a 45° angle relative to the flanges. The protrusions can be bent or otherwise disposed at any angle between 0-180° degrees relative to a surface of the anterior and posterior flanges. Preferably, one or more of the protrusions are disposed at an angle relative to a surface of the anterior and posterior flanges ranging between 30-60°, or between 15-90°, or between 5-50°, or between 10-75°, or between 20-35°, or between 25-40°, or between 55-80°, or between 65-85°, or between 70-95°, or between 100-130°, or between 105-145°, or between 110-150°, or between 160-175°. The protrusions can also be flexible and allow for bending of the protrusions into any desired position, or for re-positioning the protrusions, during installation of the system.

To install the electronics devices on the support bar and thus within the rack system, one or more of the protrusions 23 of support bar 21 can be inserted through one or more voids of the mesh to allow for interconnection between the mesh and protrusion(s). As shown on the equipment 1 on the right-hand side of FIG. 2, alternatively the mesh securing means can comprise only strips of material instead of also including a substantially planar sheet portion of mesh. Such configurations (use of strips only and/or use of a thin-walled network of mesh) can increase heat dissipation from the device during use. Additionally, a heat sink type material can also be used as the mesh itself and/or incorporated into the securing mesh to capture heat from the device and transfer it into the atmosphere surrounding the device. Although separate mesh securing means 20 are used for each of the two components shown in FIG. 2, a plurality of electronics equipment 1 can also be secured by a single securing means 20.

FIG. 3 is a schematic diagram showing a top perspective view of a mounting system 300 for securing a plurality of small electronic devices 1 mounted on a single rigid support 31. Preferred components are desktop style electronics components that lack the requisite hardware for securing the components to an industrial style components rack. As shown, two individual desktop style electronics components are installed on a single rack. Here different configurations of mesh-type securing means 30 are highlighted. The mesh 30 supporting the electronic device 1 in the left of the figure is a single sheet cut to fit the device. Alternative embodiments include that the flexible mounting web has a planar sheet of material connected with straps for securing the web to the support bar 31. The electronic device 1 shown on the right is secured using three narrow mesh strips 30 cut to appropriate length. Any number of flexible strips can be used to secure one or more desktop devices to support bar 31. For example, 1, 2, 3, 4, 5, 6, 7, 8, 9, 10, 11, 12, 13, 14, 15, 16, 17, 18, 19, or 20 strips of material 30 can be used to secure 1, 2, 3, 4, 5, 6 and so on devices to one or more support bars 31. Preferably, the mesh 30 is secured to support 31 by way of engaging with one or more protrusions 33 integral to the support.

FIG. 4 is a bottom perspective view of a schematic diagram of a mounting system 400 according to embodiments of the invention illustrating one small electronic device 1 without external means for connecting the device to an industrial style rack which is mounted on a single rigid support 41 using mesh strips 40 connecting to the hooks 43 formed into the bottom edges of the rigid support 41. In this embodiment, the protrusions 43 are integral to the anterior and posterior flanges of support bar 41 and are bent slightly inward. The mesh 40 can also be stretched along one side of equipment 1 past one flange and secured to the opposing flange. In such embodiments, the protrusions 43 for catching the mesh 40 are preferably bent outward so that the mesh 40 once connected to the protrusion 43 pulls on the protrusion under tension and is secured thereto without threat of being dislodged.

FIGS. 5A and 5B are schematic diagrams showing respectively front and side elevation views of electronic devices 1 capable of being secured to a rigid support bar 51 using mesh mounting means (not shown) in combination with corresponding molded hooks 53 on the rigid support 51. The mesh and protrusions 53 on support 51 are operably configured for releasable engagement with one another. In this embodiment, the hooks or protrusions 53 are integral to the support bar 51. Such a configuration allows for ease of manufacturing in that a single sheet of metal can be punched to create the desired shape and size of the support bar and protrusions 53 and then the anterior and posterior flanges bent into a generally U-shaped structure. Further, the hooks 53 can be left in the same plane as the side of support bar 51, or can bent inward (as shown) or outward to a desired angle. The shape of the hooks 53 can be of any shape which leads to ease of manufacturing and strength of the support bar 51. Here, the protrusions 53 are of a castellated form comprising a series of protrusions 53 alternating with notches. The protrusions 53 can be uniformly or non-uniformly spaced and/or sized. Any number of protrusion can be disposed along one or both of the anterior and posterior flanges. For example, one or both of the flanges can comprise protrusions 53 from about 1-100 protrusions, or about 2-90, or about 3-80, or about 4-70, or about 5-60, or about 6-50, or about 7-40, or about 8-30, or about 9-20, or about 10-95, or about 15-85, or about 25-75, or about 35-65, or about 45-55 and so on. Generally, the greater number of protrusions disposed along the length of the flanges provides for greater flexibility in the manner of securing the mesh to the support bar 51. In preferred embodiments, the support bar 51 comprises from 1-10 protrusion per inch, such as from 2-9 protrusions per inch, or 3-8 protrusions per inch, or 4-20 protrusions per inch, or from 5-15 protrusions per inch, or 6-18 protrusions per inch, or 7-25 protrusions per inch, or 8-30 protrusions per inch, or 11-14 protrusions per inch, or 12-13 protrusions per inch, and so on.

FIGS. 6A and 6B are schematic diagrams showing respectively front and side elevation views of desktop style electronic devices 1 capable of being secured to a rigid support 61 using a hook 63 and loop (not shown) type securing means comprising a mesh mounting means (to provide the loops, which is not shown) in combination with corresponding hooks or pins 63 integral to or inserted into the rigid support 61. In this embodiment, the support bar 61 can be formed from a single piece of sheet metal and bent into a desired shape, such as a C-shape or a U-shape. Pins 63 can then be attached (such as by soldering, riveting, or screwing) to the support 63 to provide a plurality of protrusions along the length of the support for interacting with and engaging a corresponding mesh securing means. In one embodiment, a portion of the anterior and posterior flanges of support bar 61 can be bent at an additional right angle relative to the anterior and posterior flanges to dispose a newly created surface that is approximately parallel with the upper support surface of support bar 61, or otherwise referred to as the C-shape. The pins 63 can then be inserted into these surfaces. The pins 63 can be removable screw type pins, rivets, or pins soldered to the support 61. As shown, the pins 63 can be disposed on or in the support 61 in a manner that provides pins 63 disposed substantially perpendicular to the top surface of the support 61 on which the electronics components 1 will sit during use. Alternatively, the pins 63 can be inserted into or disposed on the support 61 at any angle relative thereto. Likewise, the flanges can also be disposed at an angle relative to the upper support bar surface to achieve the same result. Then flanges can be disposed at any angle and especially the angular ranges proved above concerning the protrusion positioning.

FIGS. 7A and 7B are schematic diagrams showing respectively front and side elevation views of electronic devices 1 which can be secured to a rigid support 71 operably configured for releasable engagement with mesh-type securing means (not shown), wherein the rigid support 71 comprises wire hooks 73 implemented with bonded formed wire. Similar to the support bar 61 of FIGS. 6A and 6B, the support 71 of FIGS. 7A and 7B is of a general U-shape or C-shape. Incorporated into the support 71 are a plurality of hooks 73 shaped from wire and secured to the support 71 by soldering or other means. In this manner, the hooks 73 are turned inward to provide a minimally invasive structure with a reduced tendency to catch on unwanted items, such as hands, when the components of the system are being serviced. The hooks can also be positioned outwardly for cooperating with mesh that secures the electronics components from an opposing direction, and/or the hooks can be provided as a rotatable hook that can be rotated into any desired position.

The present invention has been described with reference to particular embodiments having various features. It will be apparent to those skilled in the art that various modifications and variations can be made in the practice of the present invention without departing from the scope or spirit of the invention. One skilled in the art will recognize that these features may be used singularly or in any combination based on the requirements and specifications of a given application or design. Other embodiments of the invention will be apparent to those skilled in the art from consideration of the specification and practice of the invention. It is intended that the specification and examples be considered as exemplary in nature and that variations that do not depart from the essence of the invention are intended to be within the scope of the invention.

The present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. It should be evident that the particular illustrative embodiments disclosed above may be altered or modified and all such variations are considered within the scope and spirit of the present invention. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

The invention claimed is:

1. A mounting system for electronics components comprising:
   a) one or more flexible and elastic plastic mesh securing member; and
   b) an elongated C- or U-shaped support bar comprising:
      an upper support surface having a width that is 5-25% of its length;
      opposing anterior and posterior flanges each with a surface disposed from 30-150° relative to and below the upper support surface;
   one or more protrusions integral to or fixedly connected directly or indirectly to the opposing anterior and posterior flanges and operably configured for releasable engagement with the mesh; and
   a plurality of through holes disposed lengthwise in the anterior flange and a plurality of through holes disposed lengthwise in the posterior flange.

2. The mounting system of claim 1, wherein the mesh comprises one or more void that is honeycomb, square, circular, oval, hexagon, pentagon, rectangular, diamond, or triangular shaped.

3. The mounting system of claim 1, wherein the mesh occupies an area and about 5-10% of its area is material and not voids.

4. The mounting system of claim 1, wherein the mesh has elasticity measured by stretching up to 450% in length without breakage and resiliency measured by returning to its original shape after stretching up to 450% in length.

5. The mounting system of claim 4, wherein the mesh has elasticity measured by stretching up to 150% in length without breakage and resiliency measured by returning to its original shape after stretching up to 150% in length.

6. The mounting system of claim 1, wherein the upper support surface has a width that is 5-10% of its length.

7. The mounting system of claim 1, wherein the support bar is U-shaped and the opposing anterior and posterior flanges are disposed at right angles to the upper support surface.

8. The mounting system of claim 1, wherein one or more of the flanges are adjustable relative to the support bar, or wherein one or more of the protrusions are adjustable relative to the flanges, or both.

9. The mounting system of claim 1, wherein the support bar is C-shaped and the flanges are L-shaped.

10. The mounting system of claim 1 wherein the one or more protrusions are configured as a plurality of protrusions disposed lengthwise along the flanges from 5-25 protrusions per inch.

11. The mounting system of claim 10, wherein the support bar, flanges, and protrusions are integral with one another and are formed from a single sheet of metal.

12. The mounting system of claim 10, wherein the flanges are L-shaped and the plurality of protrusions are molded hooks disposed in the L-shaped flanges.

13. The mounting system of claim 12, wherein the molded hooks comprise screw-type means and the flanges comprise threaded openings for receiving the screw-type means of the hooks.

14. The mounting system of claim 12, wherein the molded hooks are castellated in shape.

15. The mounting system of claim 10, wherein the flanges are L-shaped and the plurality of protrusions are wire hooks disposed in the L-shaped flanges.

16. The mounting system of claim 15, wherein the wire hooks comprise screw-type means and the flanges comprise threaded openings for receiving the screw-type means of the hooks.

17. A rack system for mounting electronics components comprising:
　a) two rails configured for attachment to one or more support bars;
　b) one or more flexible and elastic plastic mesh securing member; and
　c) an elongated C- or U-shaped support bar configured for attachment to the two rails and comprising:
　　an upper support surface having a width that is 5-25% of its length;
　　opposing anterior and posterior flanges each with a surface disposed from 30-150° relative to and below the upper support surface, and each flange with a plurality of through holes disposed along its length; and
　　one or more protrusions integral to or fixedly connected directly or indirectly to the opposing anterior and posterior flanges and operably configured for releasable engagement with the mesh.

18. The rack system of claim 17, wherein the rails comprise through holes along their length.

19. The rack system of claim 17, wherein the mesh has elasticity measured by stretching up to 150% in length without breakage and resiliency measured by returning to its original shape after stretching up to 150% in length.

20. The rack system of claim 19, wherein the mesh comprises one or more void that is honeycomb, square, circular, oval, hexagon, pentagon, rectangular, diamond, or triangular shaped.

* * * * *